United States Patent [19]
Zheng et al.

[11] Patent Number: 5,895,962
[45] Date of Patent: Apr. 20, 1999

[54] STRUCTURE AND A METHOD FOR STORING INFORMATION IN A SEMICONDUCTOR DEVICE

[75] Inventors: Hua Zheng; Michael Shore; Jeffrey P. Wright; Todd A. Merritt, all of Boise, Id.

[73] Assignee: Micron Technology, Inc., Boise, Id.

[21] Appl. No.: 08/664,109

[22] Filed: Jun. 13, 1996

[51] Int. Cl.⁶ .......................... H01L 27/04; G11C 17/00
[52] U.S. Cl. ................ 257/529; 257/758; 365/96; 326/38
[58] Field of Search ................ 365/96, 94; 326/38, 326/41, 39, 40; 257/529, 758

[56] References Cited

U.S. PATENT DOCUMENTS

| | | | |
|---|---|---|---|
| 4,455,495 | 6/1984 | Masuhara et al. | 307/44 |
| 4,534,014 | 8/1985 | Ames | 365/94 |
| 5,235,550 | 8/1993 | Zagar | 365/226 |
| 5,301,143 | 4/1994 | Ohri et al. | 365/96 |
| 5,345,110 | 9/1994 | Renfro et al. | 307/272.3 |
| 5,352,945 | 10/1994 | Casper et al. | 307/603 |
| 5,590,069 | 12/1996 | Levin | 365/96 |

*Primary Examiner*—Donald L. Monin, Jr.
*Attorney, Agent, or Firm*—Seed and Berry LLP

[57] ABSTRACT

A semiconductor device includes a plurality of conductive layers that are formed on the substrate. Two electrically intercoupled sections of a read-only storage element, such as a fuse element, which together compose the storage element, are each formed in a different one of the conductive layers. The storage element has a storage state, and each section has a conductivity. One can change the storage state of the storage element by changing the conductivity of one of the sections. Additionally, multiple storage elements may be coupled in parallel to form a storage module. Each of the storage elements of the storage module may include multiple storage sections that are each formed in a different conductive layer. The storage elements may store the version number of the mask set used to form the semiconductor device. Alternatively, a conductive layer is formed on a substrate, and one or more read-only storage elements are formed in the conductive layer. Each of the storage elements is formed in a predetermined state such that they collectively store a digital value that identifies a mask used to form the conductive layer.

8 Claims, 6 Drawing Sheets

STRUCTURE AND A METHOD FOR STORING INFORMATION IN A SEMICONDUCTOR DEVICE

TECHNICAL FIELD

The invention relates generally to electronic devices and more particularly to a structure and a method for storing information, such as identification data, on a semiconductor device.

BACKGROUND OF THE INVENTION

Many of today's integrated circuits, i.e., semiconductor devices or "chips", have stored thereon electronically readable identification information or data, such as a device's date of manufacture or the version number of the mask set used to form the device. This information is typically stored or encoded onto the semiconductor device after the formation of its integrated circuitry and its detachment from the wafer in which it was formed, but before it is packaged.

One technique for storing identification data on a semiconductor device is to encode the data in a bank of laser fuses. Typically, such a bank of laser fuses is formed in an exposed polysilicon layer of the semiconductor device. After the formation of a passivation layer, which is typically the last layer formed on the semiconductor device, portions of a passivation layer covering the bank are etched away to expose the laser fuses. Next, selected ones of the laser fuses, which are typically formed in a closed, i.e., conducting state, are cut with a precision laser to put them in an opened, i.e., nonconducting, state. Typically, each fuse stores one bit of data. For example, a closed fuse may store a logic 1, and an opened fuse may store a logic 0. Thus, the encoded laser fuses store the desired identification data on the device. After the semiconductor device is packaged, one can electrically access and read the identification data that is stored by the laser fuses.

Another technique for storing identification data on a semiconductor device is to encode a bank of electrically alterable fuses. These fuses, like the laser fuses, are formed on the semiconductor device. Because these fuses need not be accessed by a laser, however, they may be formed in any of the layers of the semiconductor device. Typically, such electrically alterable fuses are either formed in an opened state and electrically alterable to a closed state, or formed in a closed state and electrically alterable to an opened state. To encode the identification data, selected ones of the fuses are altered using a conventional semiconductor testing apparatus or another type of conventional electronic programming equipment. Like the laser fuses, each electrically alterable fuse typically stores one bit of data. After the semiconductor device is packaged, one can electrically access and read the stored identification data with a conventional device.

A circuit and a method for encoding laser or electrically alterable fuses with identification data are discussed in U.S. Pat. No. 5,301,143, entitled "Method For Identifying A Semiconductor Die Using An IC With Programmable Links", which issued to Ohri et al. on Apr. 5, 1994 and is incorporated herein by reference.

A problem with both the laser fuse and the electrically alterable fuse techniques is that they are prone to inaccuracies. For example, a slight misalignment of the semiconductor device with respect to the laser during the encoding process may cause the wrong fuses to be cut, and thus may cause the laser fuses to be encoded with erroneous identification data. Similarly, a software error may cause the wrong electrical fuses to be altered, and thus may cause the electrically alterable fuses to be encoded with erroneous identification data. Once erroneous information has been encoded, it is often difficult or impossible to correct such an error. Furthermore, with either of these techniques, there may be intermittent glitches that cause errors. The sources of these intermittent glitches are often difficult to find and eliminate.

SUMMARY OF THE INVENTION

In accordance with one aspect of the present invention, a plurality of conductive layers are formed on the substrate of a semiconductor structure or device. A read-only storage element is formed having a storage state and having two electrically intercoupled sections that are each formed in a different one of the layers. The storage state of the storage element can be changed by changing the conductivity of one of the storage elements.

In accordance with another aspect of the invention, multiple conductive layers are formed on a substrate of a semiconductor device. A read-only storage module that has a storage state and includes multiple storage elements that are electrically intercoupled in parallel. Each element includes multiple electrically and serially intercoupled read-only storage links that have a conductivity. Each storage link may be formed in a different conductive layer.

In accordance with yet another aspect of the invention, a conductive layer is formed on a substrate, and one or more read-only storage elements are formed in the conductive layer. Each of the storage elements are formed in a predetermined state such that the storage elements collectively store a digital value that identifies a mask used to form the conductive layer.

An advantage provided by one aspect of the present invention is a more reliable technique for storing data, such as identification data, on a semiconductor device.

DETAILED DESCRIPTION OF THE INVENTION

Figure 1:
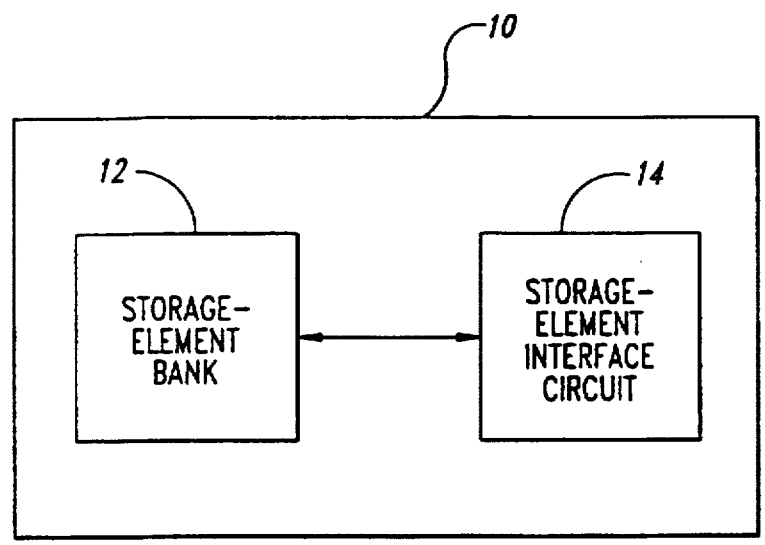
FIG. 1 is a block diagram of a semiconductor device that incorporates the present invention.

FIG. 1 is a block diagram of a semiconductor device 10, such as a dynamic random access memory (DRAM), which includes a bank 12 of read-only storage elements 16, such as fuses (not shown in FIG. 1). A storage-element interface circuit 14 is coupled to the bank 12 and includes circuitry for determining the state of each storage element and for providing this state to an external device (not shown). Circuits that are suitable for use as the interface circuit 14 are discussed in U.S. Pat. No. 5,301,143, which is incorporated above, and U.S. Pat. No. 5,345,110, entitled "Low-Power Fuse Detect and Latch Circuit", which issued to Renfro et al. on Sep. 6, 1994 and is incorporated herein by reference.

In operation, the storage elements 16 in the bank 12 are formed such that they store information that identifies the device 10. For example, the identification information may include, e.g., the version number of the mask set used to form the device 10, the date the device 10 was manufactured, the position that the device 10, in die form, occupied in a wafer (not shown), and the part number of the device 10. The stored part number is particularly useful where the printed part number has worn off or has been intentionally removed from the package (not shown) of the device 10. Techniques for encoding the elements 16 in the bank 12 are discussed below in conjunction with FIGS. 2–4.

Figure 2:
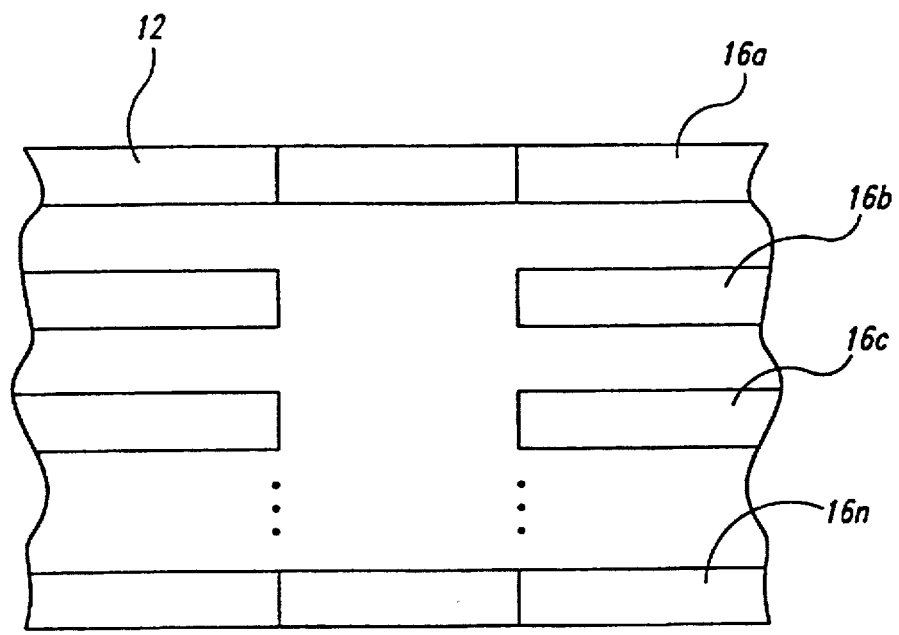
FIG. 2 is a top plan view of one embodiment of the storage-element bank of FIG. 1 with portions broken away.

FIG. 2 is a top plan view of a portion of one embodiment of the bank 12 of FIG. 1 according to the present invention. The bank 12 includes a number of read-only storage elements 16a–n. Although multiple storage elements are shown, it is understood that the bank 12 may include only one storage element 16. Typically, the storage elements 16 are each formed in a layer of conductive material within the device 10. Not all the storage elements 16 need be formed in the same conductive layer. Conductive materials that may be used to form the storage elements 16 include, e.g., polysilicon, aluminum, and other metals. For example purposes, storage elements 16a and 16n are shown in a closed state, and the storage elements 16b and 16c are shown in an opened state.

In operation, the read-only storage elements 16 are formed in their desired states. That is, the mask or masks (not shown) used to form the storage elements 16 are such that during the formation, i.e., processing, of the conductive layer or layers containing the storage elements 16, the elements 16a and 16n that are to be in a closed state to provide the desired information are formed in a closed state, and the elements 16b and 16c that are to be in an opened state to provide the desired information are formed in an opened state. Thus, the storage elements 16 are formed to store the desired information during the processing of the semiconductor device 10 (specifically, during the processing of the conductive layer containing the storage element), and not in a separate step after the processing of the device 10 as in the known techniques. Forming the storage elements 16 in their desired state during the processing of the device 10 is referred to as "preprogramming" the storage elements 16. Such preprogramming eliminates many error sources to which the prior-art techniques are susceptible, such as programming and software errors and laser alignment errors that may cause the prior-art fuse elements to be programmed in an incorrect state.

Figure 3:
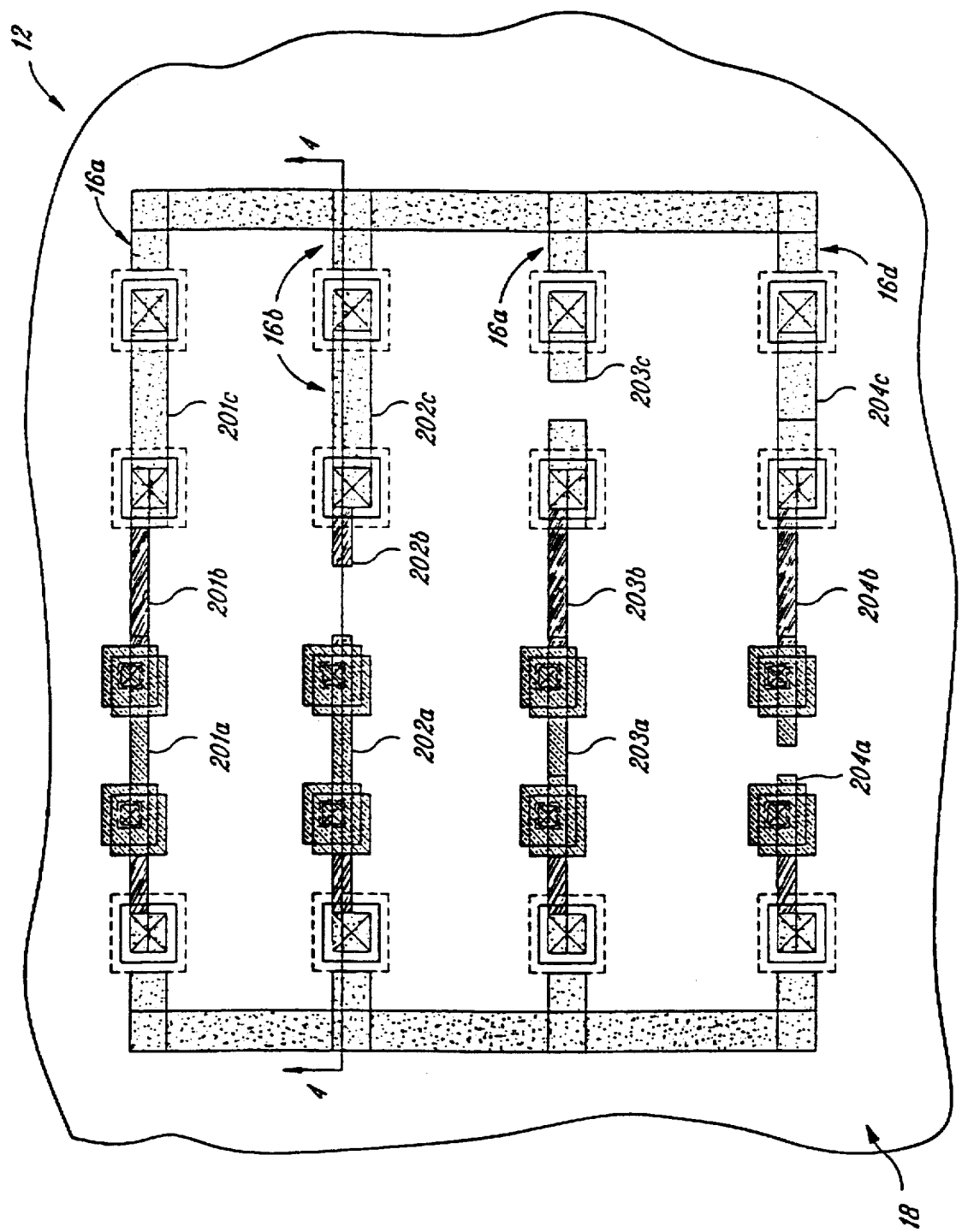
FIG. 3 is a layout diagram of a portion of another embodiment of the storage-element bank of FIG. 1.

FIG. 3 is a layout diagram of a portion of another embodiment of the storage-element bank 12 of FIG. 1. The bank 12 includes one or more read-only storage modules 18. Each storage module 18 includes a number of read-only storage elements 16 that are electrically connected in parallel. Each of the storage elements 16 includes a number of read-only storage sections or links 20 that are electrically connected in series. In the embodiment illustrated in FIG. 3, each of the storage modules 18 includes four storage elements 16, and each of the storage elements 16 includes three storage links 20, although the modules 18 may include more or fewer storage elements 16, and the storage elements 16 may each include more or fewer links 20. Each of the storage links 20 of a storage element 16 is formed in a different one of the conductive layers 22, 24, and 26 (FIG. 4) of the semiconductor device 10. Although the storage elements 16 are each shown having one link 20 per conductive layer, each storage element 16 may have more or fewer links 20 per conductive layer. In a preferred embodiment of the invention, each storage element 16 has one storage link 20 formed in each conductive layer of the semiconductor device 10. Thus, the number of links 20 in each storage element 16 equals the number of conductive layers in the semiconductor device 10. Such a structure provides advantages that are described below.

Figure 4:
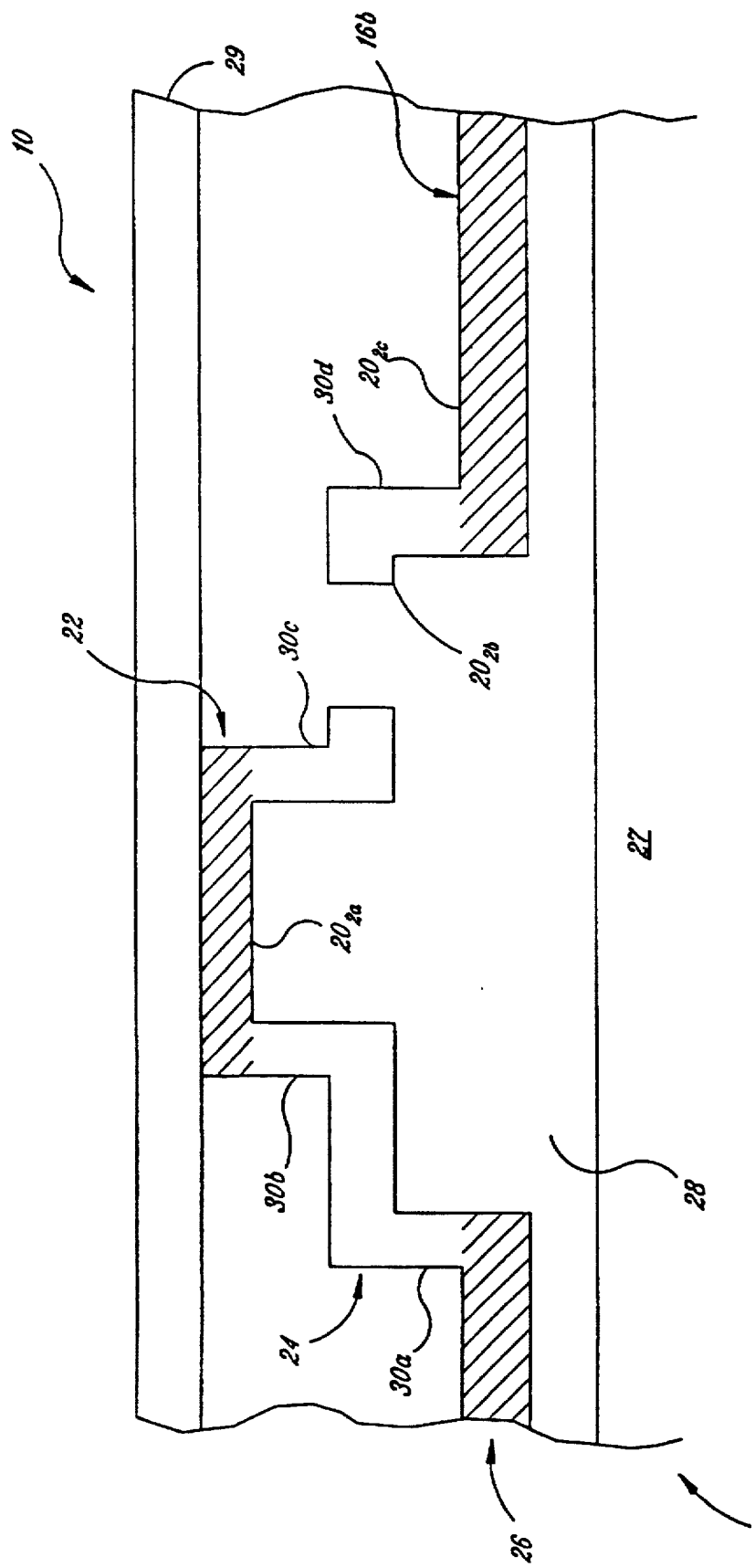
FIG. 4 is a side view of the portion of the storage-element bank of FIG. 3 taken along lines 4—4.

FIG. 4 is a side view of the device 10 taken along lines 4—4 of FIG. 3. As shown, the storage element 16b includes three storage links $20_{2a}$–$20_{2c}$, which are conventionally formed in respective conductive layers 22, 24, and 26. As shown, the links $20_{2a}$ and $20_{2b}$ are formed, i.e., preprogrammed, in a closed state, and the link $20_{2b}$ is preprogrammed in an opened state. Each of the links $20_{2a}$–$20_{2c}$ are serially coupled to one another with vertical vias $30a$–$d$. The vias 30 may be formed from any conductive material, such as aluminum or another metal, in a conventional manner. The uppermost layer 22 and the inner layers 24 and 26 are formed on a conventional substrate 27, and a conventional passivation layer 29 is formed over the uppermost conductive layer 22. In one embodiment of the invention, the layers 22 and 26 are formed from polysilicon, and the layer 24 is formed from a metal such as aluminum. One or more insulator layers 28 electrically isolate the layers 22, 24, and 26 from one another. The insulator layers 28 may be formed from, e.g., silicon dioxide. The other storage elements 16a, 16c, and 16d are typically formed in a manner similar to that in which the storage element 16b is formed. For example, referring to FIG. 3, the storage links $20_{1a}$, $20_{3a}$, and $20_{4a}$ are formed in the layer 22, the links $20_{1b}$, $20_{3b}$, and $20_{4b}$ are formed in the layer 24, and the links $20_{1c}$, $20_{3c}$, and $20_{4c}$ are formed in the layer 26.

Referring to FIGS. 3–4, in operation, the read-only storage module 18 is preprogrammed in either an opened or a closed state. That is, if at least one of the storage elements 16 is preprogrammed in a closed state, then the storage module 18 is preprogrammed in a closed state. But, if all of the storage elements 16 are preprogrammed in an opened state, then the storage module 18 is preprogrammed in an opened state.

Still referring to FIGS. 3–4, the storage module 18 is typically preprogrammed in one state such that it can be toggled to the other state by changing the state of a storage link or links 20 in only one of the layers 22, 24, or 26. For example, when the storage module 18 is used to store a bit of data that identifies the version number of the mask set used to form a particular device 10, in the first version of the mask set, the module 18 is typically preprogrammed in a closed state, with one of the storage elements, here 16a, preprogrammed in a closed state, and the remaining storage elements, here 16b–d, preprogrammed in an opened state. As shown, each of the opened storage elements 16b–d are opened in a different link 20, and, therefore, in a different layer 22, 24, or 26. For example and as shown, the links $20_{2b}$, $20_{3c}$, and $20_{4a}$ of the storage elements 16b–d respectively are preprogrammed in an opened state. In a subsequent version of the mask set for the device 10, suppose one wishes to toggle the state of the storage module 18 from the closed state shown in FIG. 3 to an opened state by changing only one or more of the storage links $20_{1c}$, $20_{2c}$, $20_{3c}$, $20_{4c}$ in the layer 26. Such may be the case when circuitry or other semiconductor structures that exist only in the layer 26 need to be changed to effect the revision of the device 10. To preprogram the storage module 18 in an opened state, the storage link 20₁ₑ is preprogrammed in an opened state instead of a closed state. Thus, in the subsequent revision of the device 10, because all of the storage elements 16a–d are preprogrammed in an opened state, the storage module 18 is preprogrammed in an opened state. Furthermore, such toggling of the state of the module 18 is accomplished by making changes thereto in only a desired one of the conductive layers 22, 24, or 26. The structure of and the techniques associated with the module 18 allow one to keep track of the mask-set version numbers by changing only the mask or masks for layers in which there are circuitry or other changes, and render unnecessary mask alterations to other conductive layers (not shown) in which there are no changes. One can also appreciate that in a further revision of the device 10, the storage module 18 can be toggled back to a closed state by closing an opened link 20 in any desired one of the layers 22, 24, and 26. In the preferred embodiment described above, the structure of module 18 allows one to toggle the state of the module 18 by making changes in any one of the conductive layers. Thus, when making mask changes to a conductive layer, one can easily toggle the state of the storage module 18 to effect a change in the stored mask-set version number. Of course, one can understand that multiple storage modules 18 can be used to store such information, with only one module 18 required to be toggled each time a mask change is made.

Figure 5:
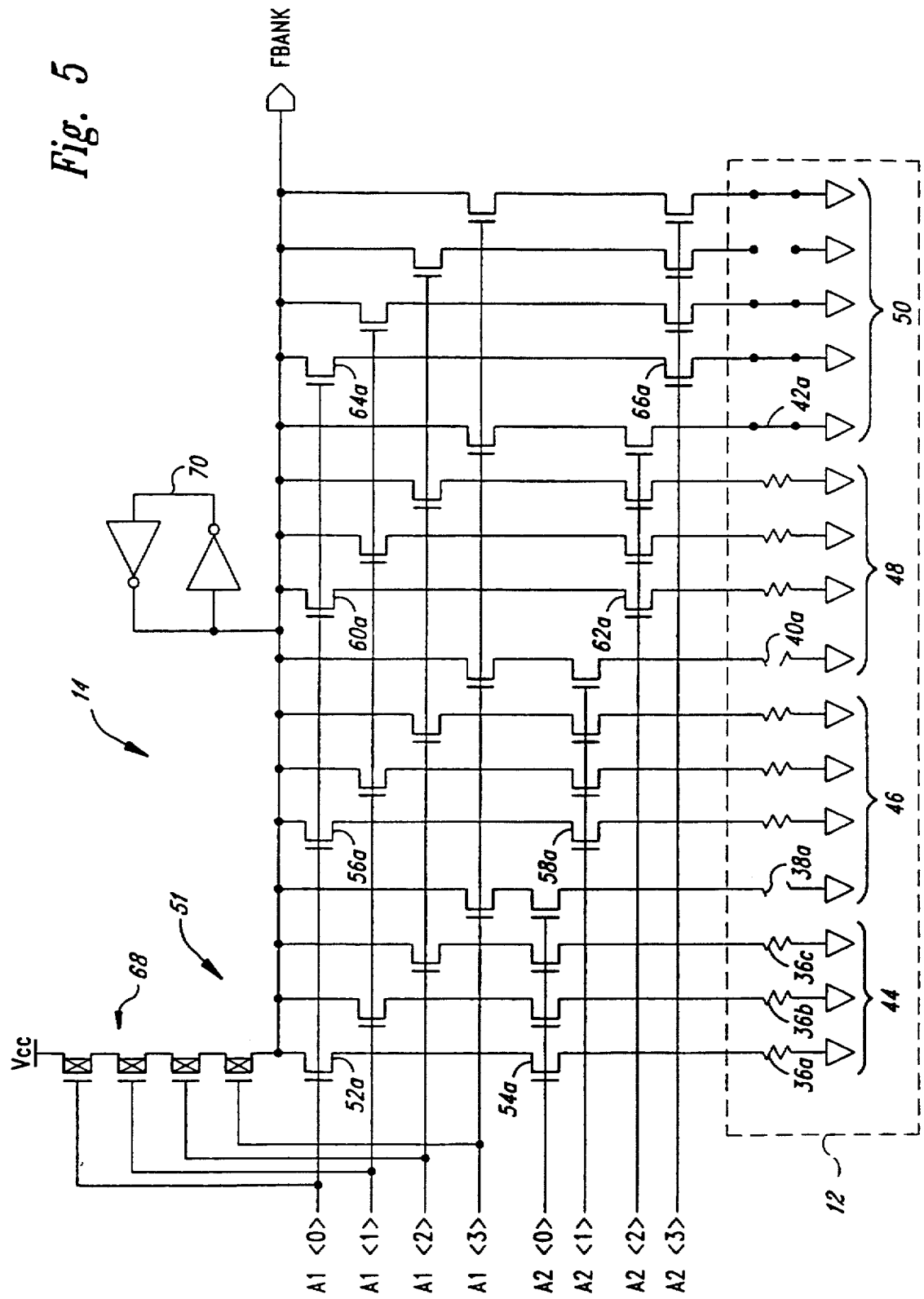
FIG. 5 is a schematic diagram of yet another embodiment of the storage-element bank of FIG. 1.

FIG. 5 is a schematic diagram of portions of the storage-element bank 12 and the storage-element interface circuit 14 of FIG. 1. The bank 12 includes one or more sets of read-only storage elements per each of a number of conductive layers of the memory device 10 of FIG. 1. The number of conductive layers that include such storage elements may range from one to the total number of conductive layers in the memory device 10. In the illustrated embodiment, the bank 12 includes a set of elements 36a–c in a conductive layer 44, a set of elements 38a–d in a conductive layer 46, a set of elements 40a–d in a conductive layer 48, and a set of elements 42a–e in a conductive layer 50. For example, in one embodiment of the invention, the conductive layer 44 is the second polysilicon layer, i.e., the "poly2" layer, the conductive layer 46 is the poly1 layer, the conductive layer 48 is the metal-contact layer, and the conductive layer 50 is the metal-interconnect layer. Each element 36a–c, 38a–d, 40a–d, and 42a–e is formed, i.e., preprogrammed, in a predetermined state, either conductive or nonconductive, during the fabrication of the memory device 10. Thus, the predetermined states of the elements in each set permanently store a digital value associated with the conductive layer in which the set of elements is formed. In one embodiment of the invention, the digital value identifies the version number of the mask used to form the associated conductive layer. Where there are n elements in a set, the set can track $2^n$ versions of the associated mask. For example, the set of elements 36a–c includes three elements. Thus, this set can track $2^3=8$ versions of the mask associated with the conductive layer 44. Likewise, the elements 38a–d, 40a–d, and 42a–e can respectively track 16, 16, and 32 versions of the masks used to form the conductive layers 46, 48, and 50. Thus, such a bank 12 can track a change in the version of a single mask, even if the version number of the mask set, i.e., the number associated with the set of all the masks, remains the same. Such a bank 12 is useful when specific masks from different mask sets or version numbers are combined.

FIG. 5 also includes one embodiment of a read circuit 51 for the storage-element interface circuit 14. The read circuit 51 is constructed as shown in FIG. 5, receives a storage-element position address A1(0:3) and a storage-element set address A2(0:3), and provides a serial read signal FBANK. The read circuit 51 also includes load transistors 68, position access transistors 52a–d, 56a–d, 60a–d, 64a–d, set access transistors 54a–d, 58a–d, 62a–d, and 66a–d, and a weak latch 70. For balancing purposes, set transistors 54d, 58d, and 62d are associated with elements 38a, 40a, and 42a respectively, and position transistors 52d, 56d, and 60d are associated with elements 38a, 40a, and 42a respectively.

In operation, before reading a storage element 36a–c, 38a–d, 40a–d, or 48a–e, the address bits of the position address A1(0:3) are driven to inactive logic 0's, which activate the serially coupled PMOS transistors 68. The active transistors 68 conduct, and thus precharge FBANK to Vcc, i.e., a logic 1. The weak latch 70 then maintains the logic 1 for FBANK. Next, corresponding address bits from the two addresses A1(0:3) and A2(0:3) are driven active high, and the associated pair of n-channel position and set transistors conduct and thus provide the state of the element being read as the signal FBANK. The signals FBANK from each set of storage elements form the digital value stored by the set. For example, when both address bits A1(0) and A2(0) are driven to active logic 1's, the serially coupled n-channel position and set transistors 52a and 54a, respectively, turn on, i.e., conduct, and provide the state of element 36a as the signal FBANK. If the element 36a is nonconductive, i.e., opened, then FBANK remains at its precharged value of logic 1. If the element 36a is conductive, i.e., closed, as is shown in FIG. 5, then the active transistors 52a and 54a overcome the output signal of the weak latch 70 and pull FBANK to ground, i.e., a logic 0. The read circuit 51 then precharges FBANK to Vcc before reading each element, and reads the elements 36b–c. The signals FBANK generated by the set of elements 36a–c represent the digital value stored by this set of elements. In a manner similar to that discussed for elements 36a–c, the read circuit 51 precharges FBANK and reads the elements 38a–d, 40a–d, and 42a–e.

Figure 6:
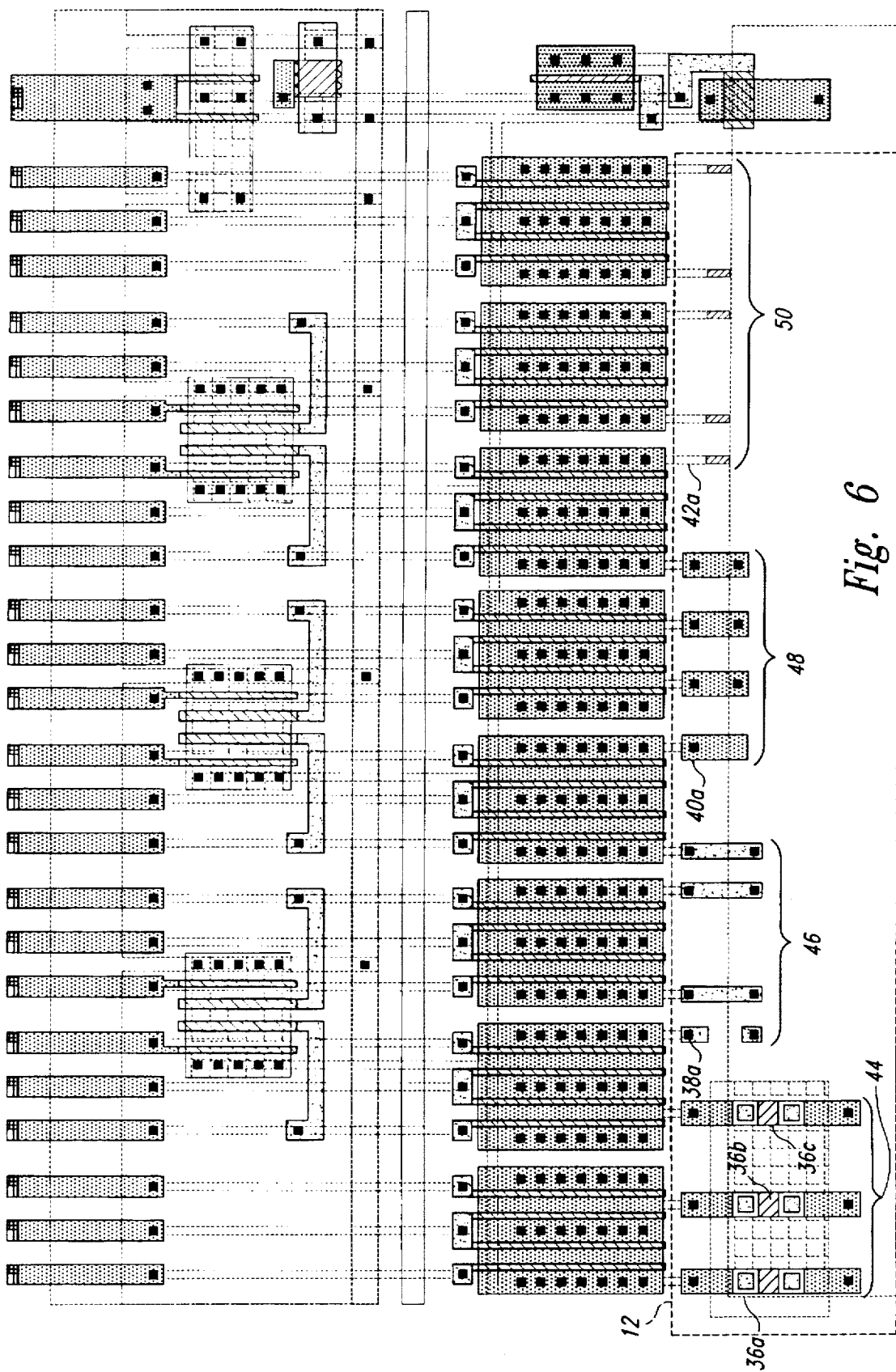
FIG. 6 is a layout diagram of the storage-element bank of FIG. 5.

FIG. 6 is a layout diagram of the circuitry shown in FIG. 5.

Figure 7:
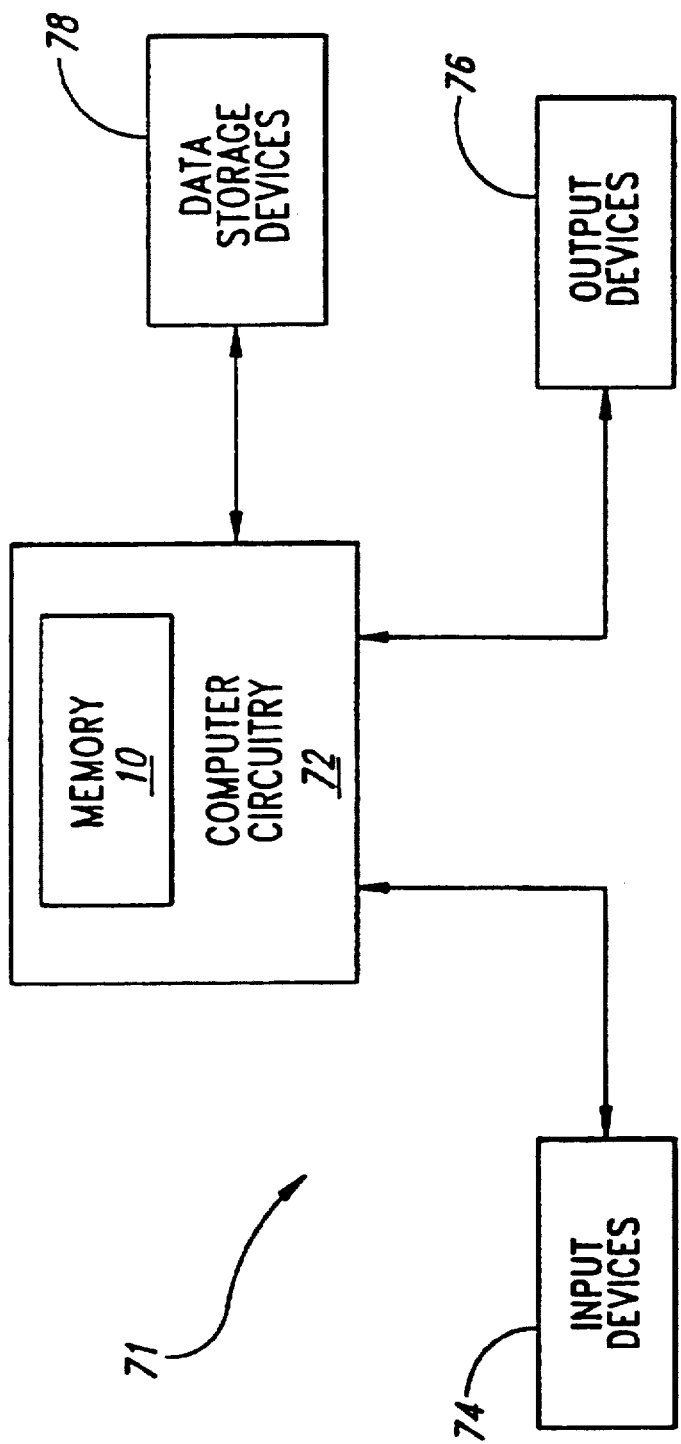
FIG. 7 is a block diagram of a computer system that incorporates a memory device formed in accordance with the present invention.

FIG. 7 is a block diagram of a computer system 71 that uses the semiconductor device 10 of FIG. 1. For example, the semiconductor device 10 may be a memory device. The computer system 71 includes computer circuitry 72 for performing computer functions, such as executing software to perform desired calculations and tasks. The circuitry 72 typically includes a processor (not shown) and the device 10. One or more input devices 74, such as a keypad or a mouse, are coupled to the computer circuitry 72 and allow an operator (not shown) to manually input data thereto. One or more output devices 76 are coupled to the computer circuitry 72 to provide to the operator data generated by the computer circuitry 72. Examples of output devices 76 include a printer and a video display unit. One or more data storage devices 78 are coupled to the computer circuitry 72 to store data on or retrieve data from external storage media (not shown). Examples of the storage devices 78 and corresponding storage media include drives that accept hard and floppy disks, tape cassettes, and compact disk read-only memories (CD-ROMs). If the device 10 is a memory device, the computer circuitry 72 is coupled to the ADDRESS and DATA buses (not shown) and the control lines (not shown) of the memory device 10. Furthermore, although shown as part of the computer circuitry 72, the device 10 may also be used in one or more of the input devices 74, output devices 76, or storage devices 78.

It will be appreciated that, although specific embodiments of the invention have been described herein for purposes of illustration, various modifications may be made without departing from the spirit and scope of the invention. For example, the fuse elements 16 and the fuse module 18 may be encoded with and thus store data other than data that identifies the semiconductor device 10. Accordingly, the invention is not limited except as by the appended claims.

We claim:

1. An integrated device, comprising:

a substrate;

a conductive layer disposed on said substrate;

one or more read-only storage elements disposed in said conductive layer, each of said storage elements having been preprogrammed in either an electrically conducting or nonconducting state such that said storage elements collectively store a digital value that identifies a mask used to form said conductive layer; and a circuit disposed in the substrate, coupled to the one or more read-only storage elements, and operable to provide a signal that corresponds to the mask used to form said conductive layer.

2. The integrated device of claim 1, further comprising a plurality of conductive layers disposed on said substrate, each conductive layer having disposed therein a respective one or more read-only storage elements, each of said respective one or more storage elements preprogrammed in either an electrically conducting or nonconducting state such that said respective one or more storage elements collectively store a respective digital value that identifies a respective mask used to form said each conductive layer, said circuit operable to provide signals that respectively correspond to the masks used to respectively form said conductive layers.

3. A semiconductor structure, comprising:

a substrate;

a first plurality of conductive layers disposed on said substrate;

a second plurality of read-only storage elements disposed in said conductive layers, each conductive layer having disposed therein a respective one of said storage elements that stores a respective data value pertaining to said each conductive layer, each of said storage elements having been preprogrammed in either an electrically conducting or nonconducting state; and a circuit disposed in the substrate, coupled to the read-only storage elements, and operable to provide signals that respectively correspond to said data values.

4. The semiconductor structure of claim 3 wherein said respective storage element stores a respective data value pertaining to a mask version number of said each conductive layer.

5. The semiconductor structure of claim 3 wherein said each conductive layer has formed therein a respective plurality of said storage elements.

6. The semiconductor structure of claim 3 wherein said first plurality equals said second plurality.

7. A computer system, comprising:

a data input device;

a data output device; and computing circuitry coupled to said data input and output devices, said computing circuitry including a memory device that includes, a substrate, a conductive layer disposed on said substrate, one or more read-only storage elements disposed in said conductive layer, each of said storage elements having been preprogrammed in either an electrically conducting or nonconducting state such that said storage elements collectively store a digital value that identifies a mask used to form said conductive layer, and a circuit disposed in the substrate, coupled to the one or more read-only storage elements, and operable to provide a signal that corresponds to the mask used to form said conductive layer.

8. The computer system of claim 7 wherein said memory device further comprises a plurality of conductive layers disposed on said substrate, each conductive layer having disposed therein a respective one or more read-only storage elements, each of said respective one or more storage elements preprogrammed in either an electrically conducting or nonconducting state such that said respective one or more storage elements collectively store a respective digital value that identifies a respective mask used to form said each conductive layer, said circuit operable to provide signals that respectively correspond to the masks used to respectively form said conductive layers.

* * * * *